United States Patent
Gill

(10) Patent No.: US 6,600,184 B1
(45) Date of Patent: Jul. 29, 2003

(54) SYSTEM AND METHOD FOR IMPROVING MAGNETIC TUNNEL JUNCTION SENSOR MAGNETORESISTANCE

(75) Inventor: Haradayal Singh Gill, Palo Alto, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/106,508

(22) Filed: Mar. 25, 2002

(51) Int. Cl.$^7$ ............................................. H01L 31/062
(52) U.S. Cl. ......................................... 257/295; 257/25
(58) Field of Search ..................... 257/295, 25

(56) References Cited

U.S. PATENT DOCUMENTS

| | | | |
|---|---|---|---|
| 5,686,838 A | 11/1997 | van den Berg | 324/252 |
| 5,695,864 A | 12/1997 | Slonczewski | 428/212 |
| 5,764,567 A | 6/1998 | Parkin | 365/173 |
| 5,986,858 A | 11/1999 | Sato et al. | 360/113 |
| 6,023,395 A | 2/2000 | Dill et al. | 360/113 |
| 6,051,309 A | 4/2000 | Fujikata et al. | 428/332 |
| 6,114,719 A | 9/2000 | Dill et al. | 257/295 |
| 6,124,711 A | 9/2000 | Tanaka et al. | 324/252 |
| 6,166,948 A | 12/2000 | Parkin et al. | 365/173 |
| 6,178,074 B1 * | 1/2001 | Gill | 360/324.2 |
| 6,252,796 B1 | 6/2001 | Lenssen et al. | 365/173 |
| 6,262,869 B1 | 7/2001 | Lin et al. | 360/324.11 |
| 2001/0007532 A1 | 7/2001 | Sato et al. | 365/173 |

FOREIGN PATENT DOCUMENTS

JP  2001-68759  3/2001  ........................ 43/8

OTHER PUBLICATIONS

Han, Xiu–Feng et al., "Analyses of intrinsic magnetoelectic properties in spin–valve–type tunnel junctions with high magnetoresistance and low resistance" The American Physical Society, May 9, 2001.

"Hybrid GMR sensor using granular GMR film" Disclosed by International Business Machines Corporation, Jan. 2000.

A. Vedyayev et al., "Giant tunnel magnetoresistance in multilayered metal/oxide structures comprising multiple quantum wells", IOP Publishing Ltd. Mar. 16, 1998.

* cited by examiner

Primary Examiner—Hoai Ho
Assistant Examiner—Tu-Tu Ho
(74) Attorney, Agent, or Firm—Silicon Valley IP Group; Kevin J. Zilka

(57) ABSTRACT

A magnetic tunnel junction (MTJ) sensor system and a method for fabricating the same are provided. First provided is an antiferromagnetic (AFM) layer. A first ferromagnetic layer with a pinned magnetization is disposed adjacent to the AFM layer for serving as a pinned layer. Next included is a tunnel barrier layer adjacent to the first ferromagnetic layer, and a second ferromagnetic layer adjacent to the tunnel barrier layer. Adjacent to the second ferromagnetic layer is a spacer. A third ferromagnetic layer is positioned adjacent to the spacer for working in conjunction with the second ferromagnetic layer to serve as a free layer. The magnetization direction of the pinned layer is substantially perpendicular to the magnetization direction of the free layer at zero applied magnetic field. A cap layer resides adjacent to the third ferromagnetic layer. A thickness of the first ferromagnetic layer and second ferromagnetic layer is selected to achieve a resonant tunneling effect.

41 Claims, 6 Drawing Sheets

SYSTEM AND METHOD FOR IMPROVING MAGNETIC TUNNEL JUNCTION SENSOR MAGNETORESISTANCE

FIELD OF THE INVENTION

The present invention relates to magnetic tunnel junction sensors for reading signals recorded in a magnetic storage medium, and more particularly, this invention relates to improving the magnetoresistance of magnetic tunnel junction sensors.

BACKGROUND OF THE INVENTION

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

FIG. 1 shows a typical spin valve sensor 100 (not drawn to scale) comprising end regions 104 and 106 separated by a central region 102. The central region 102 has defined edges and the end regions are contiguous with and abut the edges of the central region. A free layer (free ferromagnetic layer) 110 is separated from a pinned layer (pinned ferromagnetic layer) 120 by a non-magnetic, electrically-conducting spacer 115. The magnetization of the pinned layer 120 is fixed through exchange coupling with an antiferromagnetic (AFM) 125. An underlayer 126 is positioned below the AFM layer 125.

The underlayer 126, or seed layer, is any layer deposited to modify the crystallographic texture or grain size of the subsequent layers, and may not be needed depending on the substrate. A variety of oxide and/or metal materials have been employed to construct underlayer 126 for improving the properties of spin valve sensors. Often, the underlayer 126 may be formed of tantalum (Ta), zirconium (Zr), hafnium (Hf), or yttrium (Y). Ideally, such layer comprises NiFeCr in order to further improve operational characteristics.

Free layer 110, spacer 115, pinned layer 120, the AFM layer 125, and the underlayer 126 are all formed in the central region 102. Hard bias layers 130 and 135 formed in the end regions 104 and 106, respectively, provide longitudinal bias for the free layer 110. Leads 140 and 145 formed over hard bias layers 130 and 135, respectively, provide electrical connections for the flow of the sensing current $I_s$ from a current source 160 to the MR sensor 100. Sensor 170 is connected to leads 140 and 145 senses the change in the resistance due to changes induced in the free layer 110 by the external magnetic field (e.g., field generated by a data bit stored on a disk). IBM's U.S. Pat. No. 5,206,590 granted to Dieny et al. and incorporated herein by reference, discloses an MR sensor operating on the basis of the spin valve effect.

Another type of magnetic device currently under development is a magnetic tunnel junction (MTJ) device. The MTJ device has potential applications as a memory cell and as a magnetic field sensor. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ sensor, one ferromagnetic layer has its magnetic moment fixed, or pinned, and the other ferromagnetic layer has its magnetic moment free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage. IBM's U.S. Pat. No. 5,650,958 granted to Gallagher et al., incorporated in its entirety herein by reference, discloses an MTJ sensor operating on the basis of the magnetic tunnel junction effect.

FIG. 2 shows a prior art MTJ sensor 200 comprising a first electrode 204, a second electrode 202, and a tunnel barrier 215. The first electrode 204 comprises a pinned layer (pinned ferromagnetic layer) 220, an antiferromagnetic (AFM) layer 230, and a seed layer 240. The magnetization of the pinned layer 220 is fixed through exchange coupling with the AFM layer 230. The second electrode 202 comprises a free layer (free ferromagnetic layer) 210 and a cap layer 205. The free layer 210 is separated from the pinned layer 220 by a non-magnetic, electrically insulating tunnel barrier layer 215. In the absence of an external magnetic field, the free layer 210 has its magnetization oriented in the direction shown by arrow 212, that is, generally perpendicular to the magnetization direction of the pinned layer 220 shown by arrow 222 (tail of an arrow pointing into the plane of the paper). A first lead 260 and a second lead 265 formed in contact with first electrode 204 and second electrode 202, respectively, provide electrical connections for the flow of sensing current Is from a current source 270 to the MTJ sensor 200. A signal detector 280, typically including a recording channel such as a partial-response maximum-likelihood (PRML) channel, connected to the first and second leads 260 and 265 senses the change in resistance due to changes induced in the free layer 210 by the external magnetic field.

Studies have been conducted relating to the affect of the design of the free layer 210 on the magnetoresistance of MTJ sensors such as that of FIG. 2. In particular, the magnetoresistance of a MTJ sensor may be improved by reducing the thickness of the free layer 210 thereof. For more information on such studies, reference may be made to: A. Vedyayev, N. Ryzhanova, R. Vlutters, B. Dieny "Giant tunnel magnetoresistance in multilayered meta/oxide structures comprising multiple quantum wells" *J Phys: Condens Matter,* 10 (1998), no, Page 5799–5805.

Unfortunately, MTJ sensor design requirements mandate that the free layer 210 be at least 30 A to afford proper operation. In particular, if the free layer 210 has a smaller thickness, the free layer 210 may become saturated, and the MTJ sensor may not exhibit linear operation.

There is thus a need for a MJT sensor system and method of manufacturing the same with a thin free layer to improve magnetoresistance, while preventing saturation and complying with design requirements.

DISCLOSURE OF THE INVENTION

A magnetic tunnel junction (MTJ) sensor system and a method for fabricating the same are provided. First provided is an antiferromagnetic (AFM) layer. A first ferromagnetic layer with a pinned magnetization is disposed adjacent to the AFM layer for serving as a pinned layer. Next included is a tunnel barrier layer adjacent to the first ferromagnetic layer, and a second ferromagnetic layer adjacent to the tunnel barrier layer. Adjacent to the second ferromagnetic layer is a spacer. A third ferromagnetic layer is positioned adjacent to the spacer for working in conjunction with the second ferromagnetic layer to serve as a free layer. The magnetization direction of the pinned layer is substantially perpendicular to the magnetization direction of the free layer at zero applied magnetic field. A cap layer resides adjacent to the third ferromagnetic layer. A thickness of the first ferromagnetic layer and second ferromagnetic layer is selected to achieve a resonant tunneling effect.

In one embodiment, the first ferromagnetic layer may include Fe. Further, the first ferromagnetic layer may include CoFe. The remaining ferromagnetic layers may include CoFe and/or NiFe. As an option, such remaining ferromagnetic layers may include a first CoFe layer, a second NiFe layer, and a third CoFe layer.

In another embodiment, the thickness of the first ferromagnetic layer and second ferromagnetic layer may each be less than 10 A. Further, the combined thickness of the second and third ferromagnetic layers may be greater than 30 A.

In still another embodiment, the tunnel barrier layer may be constructed from a non-magnetic metallic material. In particular, the tunnel barrier layer may include AlOx, AlN, and/or MgO. Further, the spacer may include Cu and/or CuOx. In use, the spacer decouples the second ferromagnetic layer and the third ferromagnetic layer.

Another magnetic tunnel junction (MTJ) sensor system is also provided. Included is an antiferromagnetic (AFM) layer. Adjacent to the AFM layer is a first ferromagnetic layer with a pinned magnetization for serving as a pinned layer. Associated therewith is a first tunnel barrier layer adjacent to the first ferromagnetic layer. A second ferromagnetic layer is positioned adjacent to the tunnel barrier layer. Instead of a spacer, a second tunnel barrier layer is disposed adjacent to the second ferromagnetic layer. A third ferromagnetic layer is positioned adjacent to the second tunnel barrier layer for working in conjunction with the second ferromagnetic layer to serve as a free layer. Similar to before, the magnetization direction of the pinned layer is substantially perpendicular to the magnetization direction of the free layer at zero applied magnetic field. Again, a cap layer is positioned adjacent to the third ferromagnetic layer, and a thickness of the first ferromagnetic layer and second ferromagnetic layer is selected to achieve a resonant tunneling effect.

Still another magnetic tunnel junction (MTJ) sensor system is also provided. Similar to before, an antiferromagnetic (AFM) layer, a first ferromagnetic layer, a first tunnel barrier layer, a second ferromagnetic layer, a second tunnel barrier layer, and a third ferromagnetic layer are provided. Still yet, a third tunnel barrier layer is positioned adjacent to the third ferromagnetic layer. Further, a fourth ferromagnetic layer is disposed adjacent to the third tunnel barrier layer for working in conjunction with the second ferromagnetic layer and the third ferromagnetic layer to serve as a free layer. The magnetization direction of the pinned layer is substantially perpendicular to the magnetization direction of the free layer at zero applied magnetic field. Again, a cap layer is disposed adjacent to the third ferromagnetic layer. Further, a thickness of the first ferromagnetic layer and second ferromagnetic layer is selected to achieve a resonant tunneling effect.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

Figure 1:
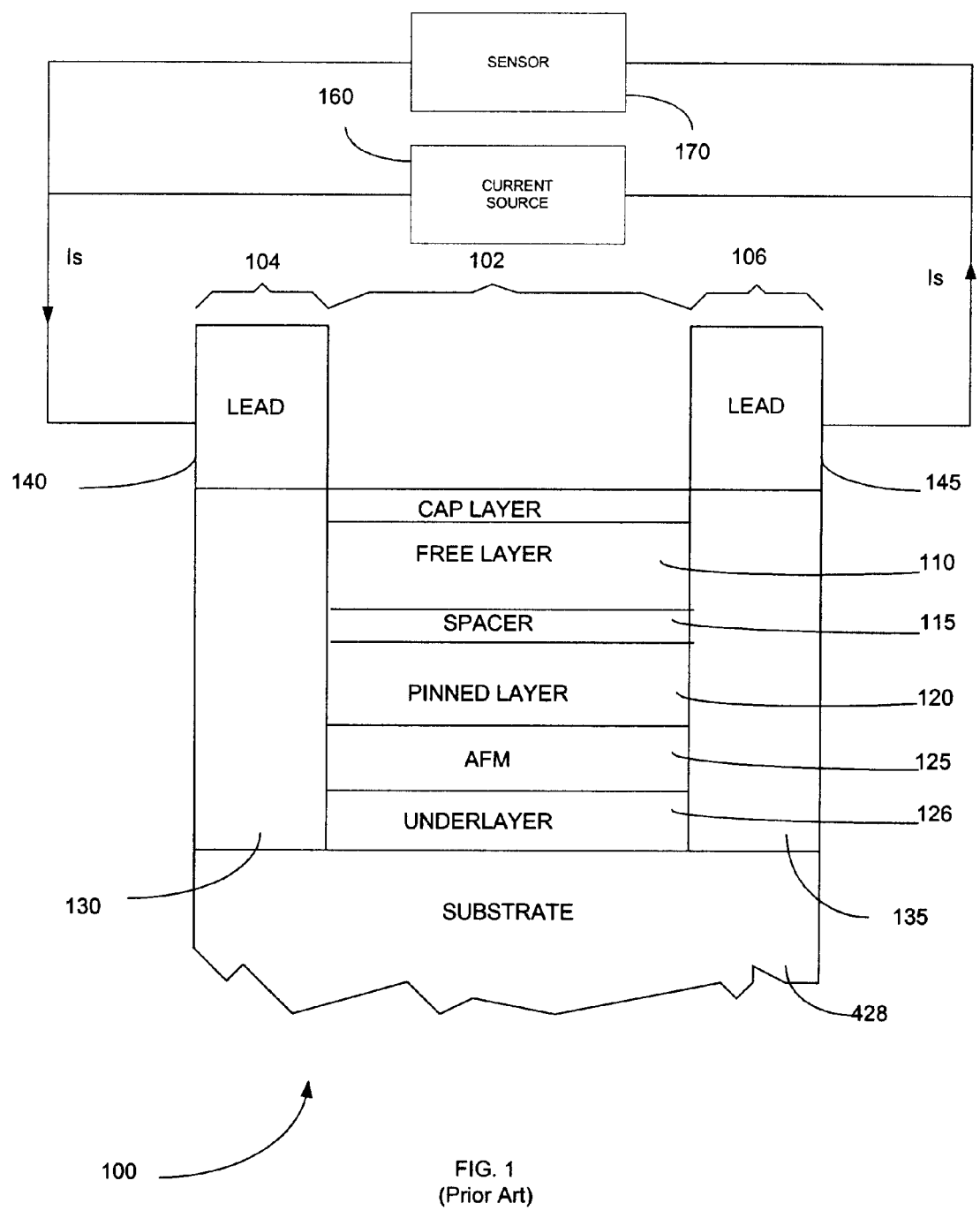
FIG. 1 is a schematic diagram of the cross-section of a prior art magnetoresistive read (MR) sensor, not drawn to scale.
Figure 2:
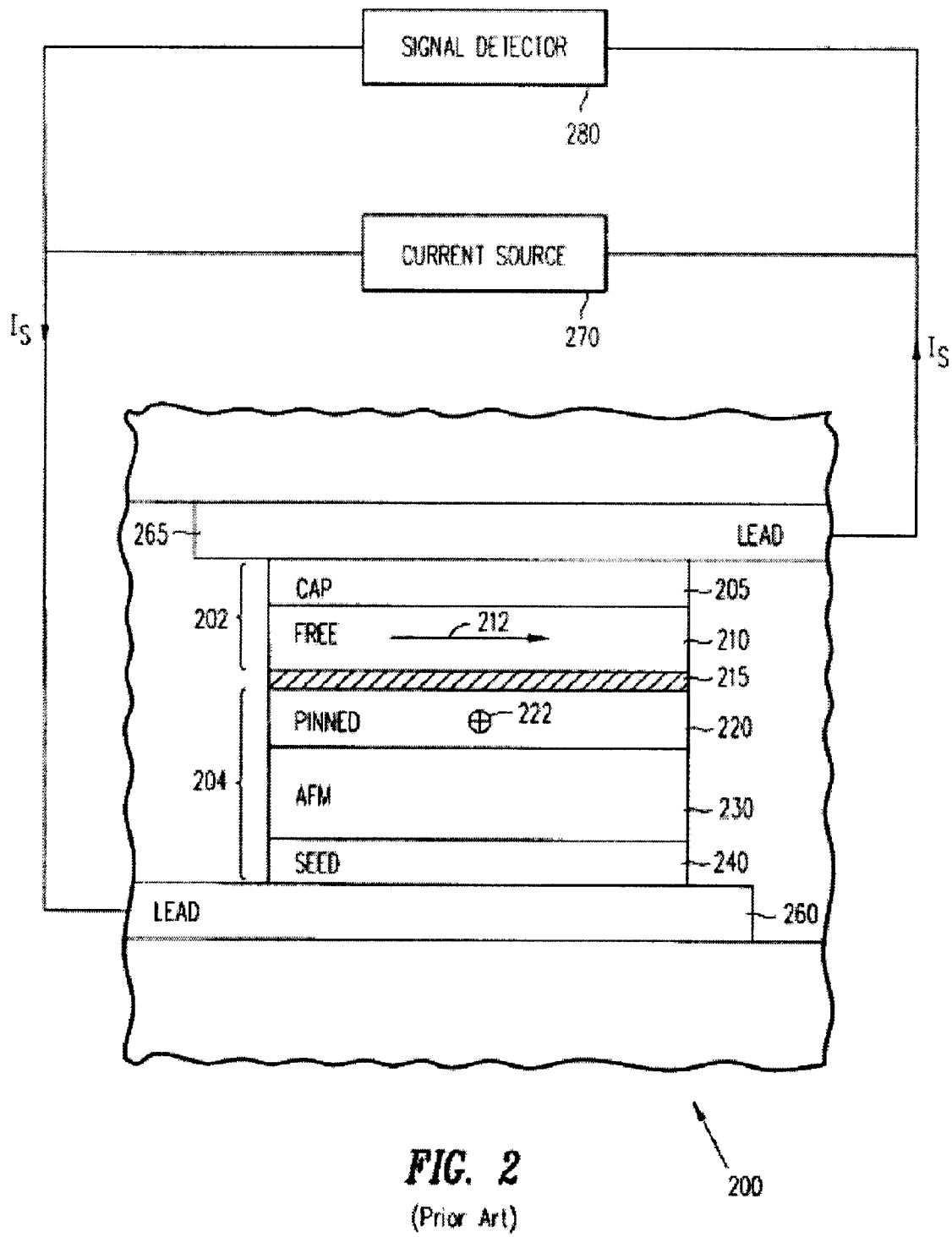
FIG. 2 shows a prior art magnetic tunnel junction (MTJ) sensor, not drawn to scale.
Figure 3:
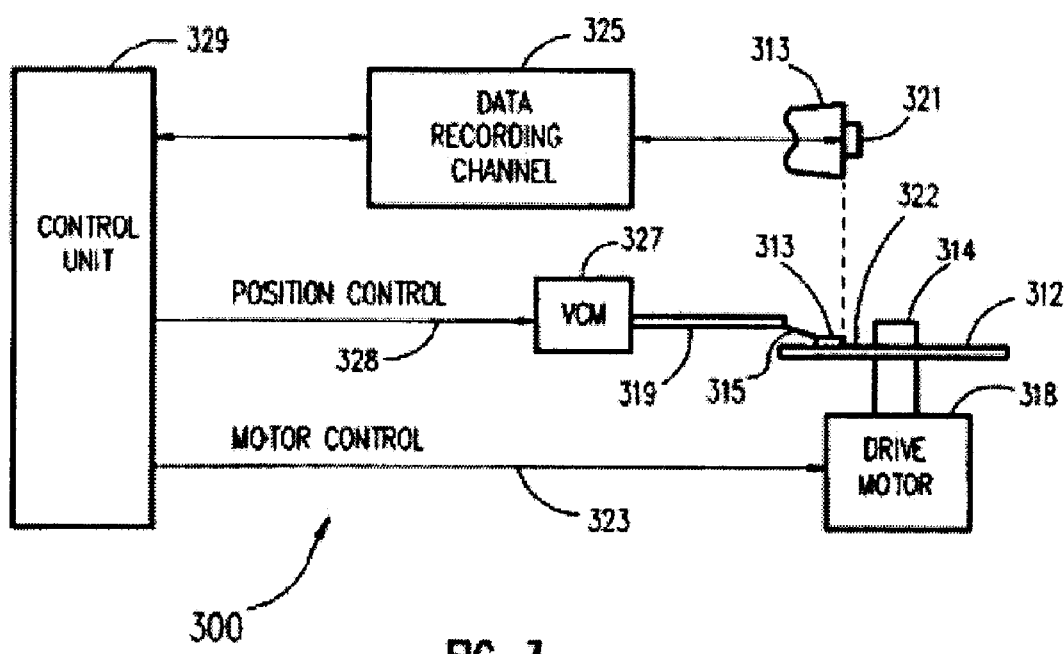
FIG. 3 is a perspective drawing of a magnetic recording disk drive system.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321 where the head 321 incorporates the magnetic tunnel junction (MTJ) sensor of the present invention. As the disks rotate, slider 313 is moved radially in and out over disk surface 322 so that heads 321 may access different portions of the disk where desired data are recorded. Each slider 313 is attached to an actuator arm 319 by way of a suspension 315. The suspension 315 provides a slight spring force which biases slider 313 against the disk surface 322. Each actuator arm 319 is attached to an actuator 327. The actuator 327 as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by way of recording channel 325.

The above description of a magnetic disk storage system of the present invention, and the accompanying illustration of FIG. 3 are for representation purposes only. It should be apparent that disk storage systems may contain a large number of disks and actuators, and each actuator may support a number of sliders.

Figure 4:
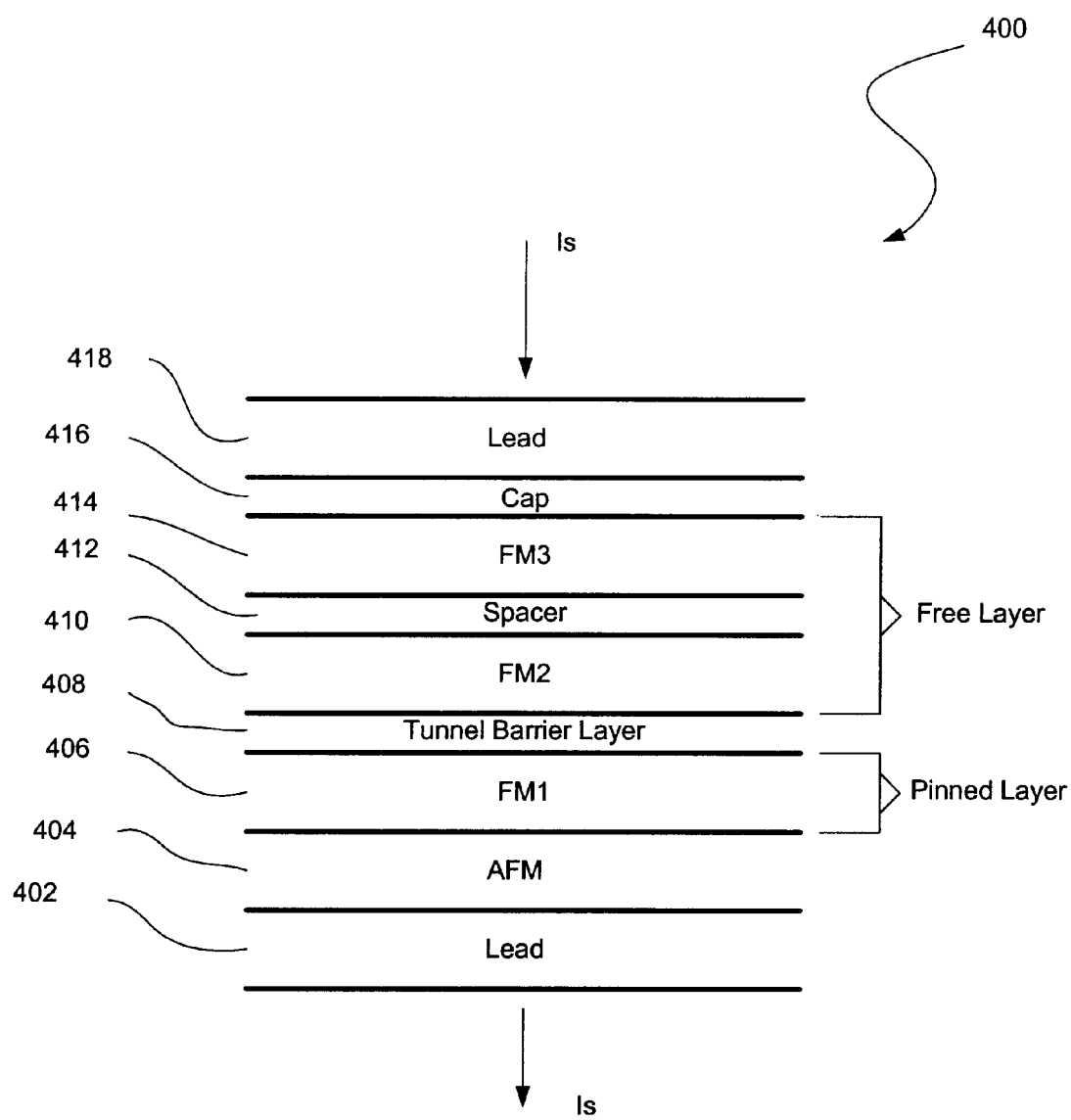
FIG. 4 is a MJT sensor system, in accordance with one embodiment.

Now referring to FIG. 4, there is shown a MJT sensor system 400 in accordance with one embodiment. While the present MJT sensor system 400 may be constructed in the context of the magnetic disk storage system of FIG. 3, it should be noted that the MJT sensor system 400 may be implemented in any desired context.

As shown, first provided is a lead layer 402 and an antiferromagnetic (AFM) layer 404 positioned thereon. A first ferromagnetic layer 406 with a pinned magnetization is disposed adjacent to the AFM layer 404 for serving as a pinned layer. Next included is a tunnel barrier layer 408 adjacent to the first ferromagnetic layer 406, and a second ferromagnetic layer 410 adjacent to the tunnel barrier layer 408. Adjacent to the second ferromagnetic layer 412 is a spacer 412. Further, the spacer 412 may include Cu and/or CuOx, where x includes a feasible integer (i.e. 1, 2, 3, etc.). In use, the spacer 412 decouples the second ferromagnetic layer 410 and the third ferromagnetic layer 414.

A third ferromagnetic layer 414 is positioned adjacent to the spacer 412 for working in conjunction with the second ferromagnetic layer 410 to serve as a free layer. The magnetization direction of the pinned layer is substantially perpendicular to the magnetization direction of the free layer at zero applied magnetic field. A cap layer 416 resides adjacent to the third ferromagnetic layer 414. A thickness of the first ferromagnetic layer 406 and second ferromagnetic layer 410 is selected to achieve a resonant tunneling effect. A second lead layer 418 is positioned above the cap layer 416.

Figure 5:
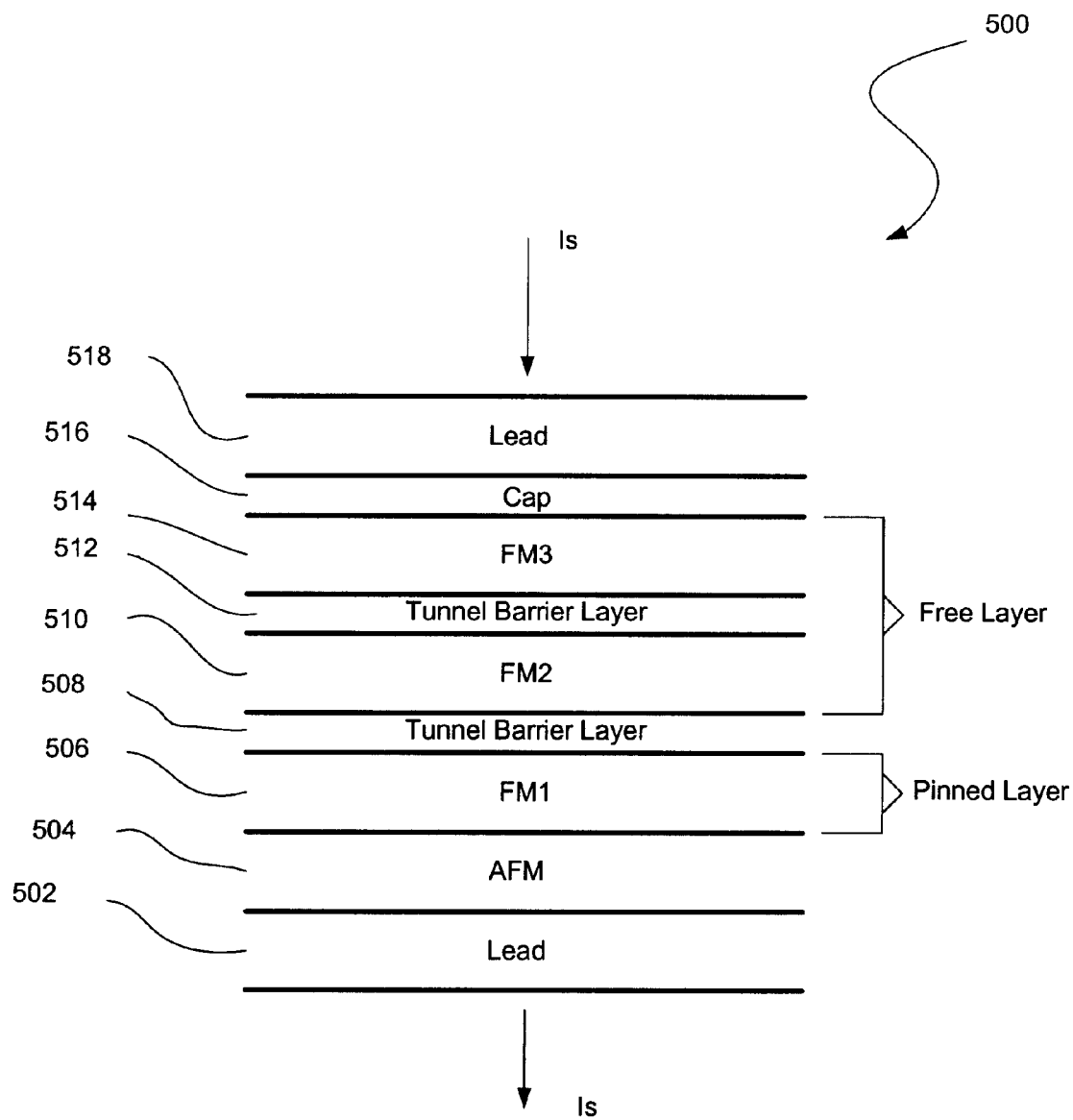
FIG. 5 shows another MJT sensor system, in accordance with one embodiment.

FIG. 5 shows another MJT sensor system 500, in accordance with one embodiment. As shown, first provided is a lead layer 502 and an antiferromagnetic (AFM) layer 504 positioned thereon. A first ferromagnetic layer 506 with a pinned magnetization is disposed adjacent to the AFM layer 504 for serving as a pinned layer. Next included is a first tunnel barrier layer 508 adjacent to the first ferromagnetic layer 506, and a second ferromagnetic layer 510 adjacent to the first tunnel barrier layer 508.

Instead of a spacer, a second tunnel barrier layer 512 is disposed adjacent to the second ferromagnetic layer 510. A third ferromagnetic layer 514 is positioned adjacent to the second tunnel barrier layer 510 for working in conjunction with the second ferromagnetic layer 510 to serve as a free layer. Similar to before, the magnetization direction of the pinned layer is substantially perpendicular to the magnetization direction of the free layer at zero applied magnetic field. Again, a cap layer 516 is positioned adjacent to the third ferromagnetic layer 514, and a thickness of the first ferromagnetic layer 506 and second ferromagnetic layer 510 is selected to achieve a resonant tunneling effect. A second lead layer 518 is positioned above the cap layer 516.

Figure 6:
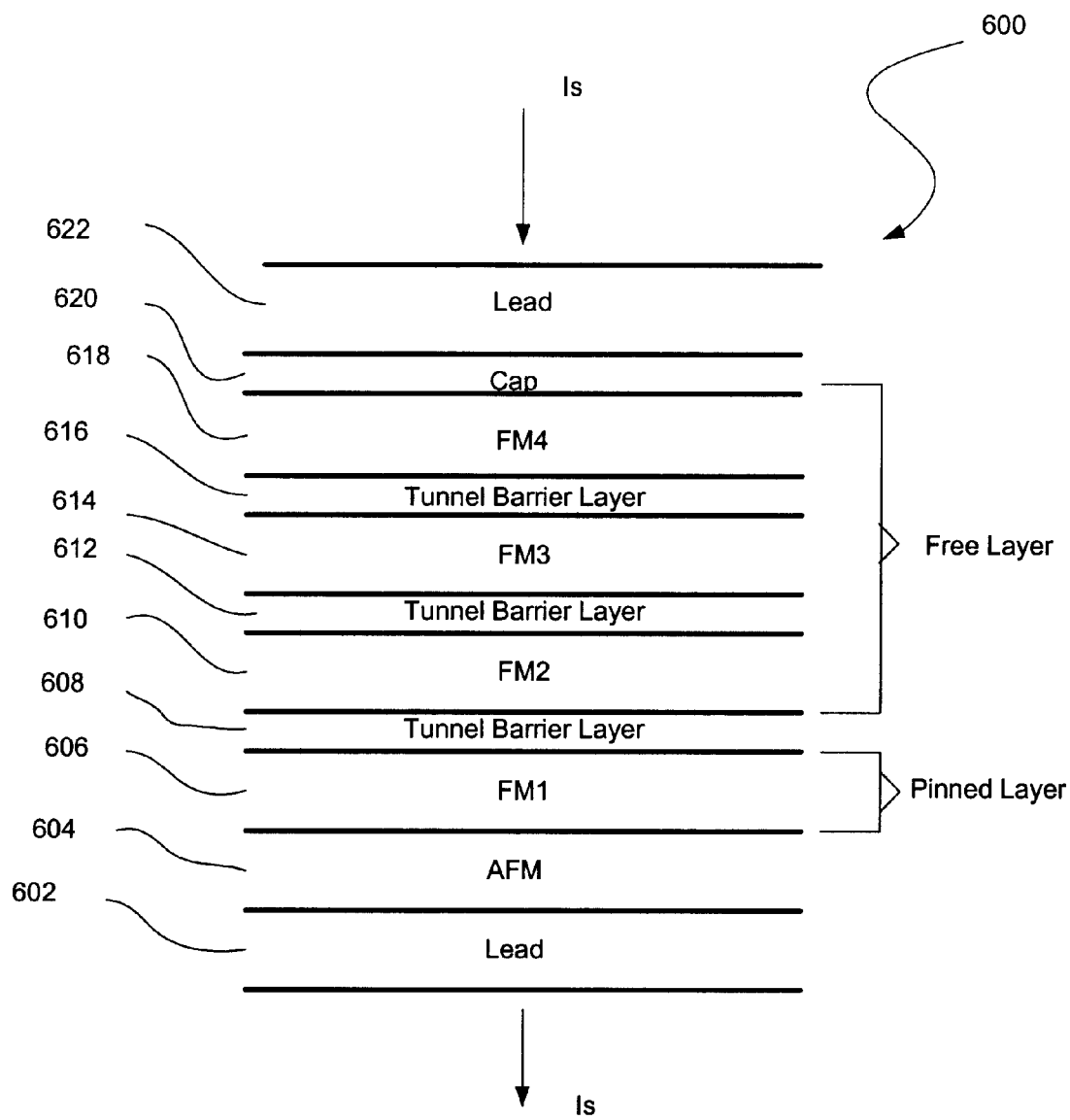
FIG. 6 shows still another MJT sensor system, in accordance with one embodiment.

FIG. 6 shows still another MJT sensor system 600, in accordance with one embodiment. Similar to before, a first lead layer 602, antiferromagnetic (AFM) layer 604, a first ferromagnetic layer 606, a first tunnel barrier layer 608, a second ferromagnetic layer 610, a second tunnel barrier layer, 612 and a third ferromagnetic layer 614 are provided. Still yet, a third tunnel barrier layer 616 is positioned adjacent to the third ferromagnetic layer 614. Further, a fourth ferromagnetic layer 618 is disposed adjacent to the third tunnel barrier layer 616 for working in conjunction with the second ferromagnetic layer 610 and the third ferromagnetic layer 614 to serve as a free layer.

The magnetization direction of the pinned layer is substantially perpendicular to the magnetization direction of the free layer at zero applied magnetic field. Again, a cap layer 620 is disposed adjacent to the third ferromagnetic layer 614. Further, a thickness of the first ferromagnetic layer 606 and second ferromagnetic layer 610 is selected to achieve a resonant tunneling effect. A second lead layer 622 is positioned above the cap layer 620.

In any of the embodiments of FIGS. 4–6, the first ferromagnetic layer may include Fe. Further, the first ferromagnetic layer may include CoFe. The remaining ferromagnetic layers (i.e. second, third, and fourth ferromagnetic layers) may include CoFe and/or NiFe. As an option, such remaining ferromagnetic layers may include a first $Co_{90}Fe_{10}$ layer, a second $Ni_{80}Fe_{20}$ layer above the first $Co_{90}Fe_{10}$ layer, and a third $Co_{90}Fe_{10}$ layer above the second $Ni_{80}Fe_{20}$ layer.

As an option, the tunnel barrier layer(s) may be constructed from a non-magnetic metallic material. In particular, the tunnel barrier layer may include AlOx, AlN, and/or MgO.

Traditionally, the resonant tunneling effect refers to when a Fermi energy coincides with a quantum well level, and is characterized by incident electrons undergoing multiple reflections on the edges of the well. These reflections lead to a very strong enhancement of the transmission of spin down electrons through the barrier. Since this effect does not occur for spin up electrons, it results in a strong enhancement in the effective polarization of the tunnel electrons and therefore in a strong increase in MR amplitude. For more information on the resonant tunneling effect in the context of MR heads, reference may be made to A. Vedyayev et al., "Giant Tunnel Magnetoresistance in Multilayered Metal/Oxide Structures Comprising Multiple Quantum Wells", Journal of Physics—Condensed Matter 1998, Vol. 10, Iss. 26, pp. 5799–5806, which is incorporated herein by reference.

To achieve the resonant tunneling effect in the context of the present invention, the thickness of the first ferromagnetic layer and second ferromagnetic layer may each be less than 10 A. The remaining ferromagnetic layer(s) [i.e. second and possible third ferromagnetic layer(s)] may work in conjunction to provide a combined thickness greater than 30 A or any other desired value. Thus, the resonant tunneling effect is provided to improve magnetoresistance, while saturation is prevented.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A magnetic tunnel junction (MTJ) sensor device, comprising:
    an antiferromagnetic (AFM) layer;
    a first ferromagnetic layer with a pinned magnetization adjacent to the AFM layer for serving as a pinned layer;
    a tunnel barrier layer adjacent to the first ferromagnetic layer;
    a second ferromagnetic layer adjacent to the tunnel barrier layer;
    a spacer adjacent to the second ferromagnetic layer;
    a third ferromagnetic layer adjacent to the spacer for working in conjunction with the second ferromagnetic layer to serve as a free layer, the magnetization direction of the pinned layer being substantially perpendicular to the magnetization direction of the free layer at zero applied magnetic field; and
    a cap layer adjacent to the third ferromagnetic layer;
    wherein a thickness of the first ferromagnetic layer and second ferromagnetic layer is selected to achieve a resonant tunneling effect.

2. The MJT sensor device as recited in claim 1, wherein the first ferromagnetic layer includes Fe.

3. The MJT sensor device as recited in claim 1, wherein the first ferromagnetic layer includes CoFe.

4. The MJT sensor device as recited in claim 1, wherein the second and third ferromagnetic layers include CoFe.

5. The MJT sensor device as recited in claim 1, wherein the second and third ferromagnetic layers include NiFe.

6. The MJT sensor device as recited in claim 1, wherein the second and third ferromagnetic layers include a first CoFe layer, a second NiFe layer, and a third CoFe layer.

7. The MJT sensor device as recited in claim 1, wherein the thickness of the first ferromagnetic layer and second ferromagnetic layer is less than 10 A.

8. The MJT sensor device as recited in claim 1, wherein the combined thickness of the second and third ferromagnetic layers is greater than 30 A.

9. The MJT sensor device as recited in claim 1, wherein the tunnel barrier layer is constructed from a non-magnetic metallic material.

10. The MJT sensor device as recited in claim 9, wherein the tunnel barrier layer includes AlOx.

11. The MJT sensor device as recited in claim 9, wherein the tunnel barrier layer includes AlN.

12. The MJT sensor device as recited in claim 9, wherein the tunnel barrier layer includes MgO.

13. The MJT sensor device as recited in claim 1, wherein the spacer includes Cu.

14. The MJT sensor device as recited in claim 1, wherein the spacer includes CuOx.

15. The MJT sensor device as recited in claim 1, wherein the spacer decouples the second ferromagnetic layer and the third ferromagnetic layer.

16. A magnetic tunnel junction (MTJ) sensor device, comprising:
    an antiferromagnetic (AFM) layer;
    a first ferromagnetic layer with a pinned magnetization adjacent to the AFM layer for serving as a pinned layer;
    a first tunnel barrier layer adjacent to the first ferromagnetic layer;
    a second ferromagnetic layer adjacent to the first tunnel barrier layer;
    a second tunnel barrier layer adjacent to the second ferromagnetic layer;
    a third ferromagnetic layer adjacent to the second tunnel barrier layer for working in conjunction with the second ferromagnetic layer to serve as a free layer, the magnetization direction of the pinned layer being substantially perpendicular to the magnetization direction of the free layer at zero applied magnetic field; and
    a cap layer adjacent to the third ferromagnetic layer;
    wherein a thickness of the first ferromagnetic layer and second ferromagnetic layer is selected to achieve a resonant tunneling effect.

17. The MJT sensor device as recited in claim 16, wherein the first ferromagnetic layer includes Fe.

18. The MJT sensor device as recited in claim 16, wherein the first ferromagnetic layer includes CoFe.

19. The MJT sensor device as recited in claim 16, wherein the second and third ferromagnetic layers include CoFe.

20. The MJT sensor device as recited in claim 16, wherein the second and third ferromagnetic layers include NiFe.

21. The MJT sensor device as recited in claim 16, wherein the second and third ferromagnetic layers include a first CoFe layer, a second NiFe layer, and a third CoFe layer.

22. The MJT sensor device as recited in claim 16, wherein the thickness of the first ferromagnetic layer and second ferromagnetic layer is less than 10 A.

23. The MJT sensor device as recited in claim 16, wherein the combined thickness of the second and third ferromagnetic layers is greater than 30 A.

24. The MJT sensor device as recited in claim 16, wherein the tunnel barrier layers are constructed from a non-magnetic metallic material.

25. The MJT sensor device as recited in claim 24, wherein the tunnel barrier layers include AlOx.

26. The MJT sensor device as recited in claim 24, wherein the tunnel barrier layers include AlN.

27. The MJT sensor device as recited in claim 24, wherein the tunnel barrier layers include MgO.

28. A magnetic tunnel junction (MTJ) sensor device, comprising:
    an antiferromagnetic (AFM) layer;

a first ferromagnetic layer with a pinned magnetization adjacent to the AFM layer for serving as a pinned layer;

a first tunnel barrier layer adjacent to the first ferromagnetic layer;

a second ferromagnetic layer adjacent to the first tunnel barrier layer;

a second tunnel barrier layer adjacent to the second ferromagnetic layer;

a third ferromagnetic layer adjacent to the second tunnel barrier layer;

a third tunnel barrier layer adjacent to the third ferromagnetic layer;

a fourth ferromagnetic layer adjacent to the third tunnel barrier layer for working in conjunction with the second ferromagnetic layer and the third ferromagnetic layer to serve as a free layer, the magnetization direction of the pinned layer being substantially perpendicular to the magnetization direction of the free layer at zero applied magnetic field; and a cap layer adjacent to the third ferromagnetic layer;

wherein a thickness of the first ferromagnetic layer and second ferromagnetic layer is selected to achieve a resonant tunneling effect.

29. The MJT sensor device as recited in claim 28, wherein the first ferromagnetic layer includes Fe.

30. The MJT sensor device as recited in claim 28, wherein the first ferromagnetic layer includes CoFe.

31. The MJT sensor device as recited in claim 28, wherein the second, third and fourth ferromagnetic layers include CoFe.

32. The MJT sensor device as recited in claim 28, wherein the second, third and fourth ferromagnetic layers include NiFe.

33. The MJT sensor device as recited in claim 28, wherein the second, third and fourth ferromagnetic layers include a first CoFe layer, a second NiFe layer, and a third CoFe layer.

34. The MJT sensor device as recited in claim 28, wherein the thickness of the first ferromagnetic layer and second ferromagnetic layer is less than 10 A.

35. The MJT sensor device as recited in claim 28, wherein the combined thickness of the second, third and fourth ferromagnetic layers is greater than 30 A.

36. The MJT sensor device as recited in claim 28, wherein the tunnel barrier layers are constructed from a non-magnetic metallic material.

37. The MJT sensor device as recited in claim 36, wherein the tunnel barrier layers include AlOx.

38. The MJT sensor device as recited in claim 36, wherein the tunnel barrier layers include AlN.

39. The MJT sensor device as recited in claim 36, wherein the tunnel barrier layers include MgO.

40. A method for manufacturing magnetic tunnel junction (MTJ) sensor device, comprising:

depositing an antiferromagnetic (AFM) layer;

depositing a first ferromagnetic layer with a pinned magnetization adjacent to the AFM layer for serving as a pinned layer;

depositing a tunnel barrier layer adjacent to the first ferromagnetic layer;

depositing a second ferromagnetic layer adjacent to the tunnel barrier layer;

depositing a spacer adjacent to the second ferromagnetic layer;

depositing a third ferromagnetic layer adjacent to the spacer for working in conjunction with the second ferromagnetic layer to serve as a free layer, the magnetization direction of the pinned layer being substantially perpendicular to the magnetization direction of the free layer at zero applied magnetic field; and depositing a cap layer adjacent to the third ferromagnetic layer;

wherein a thickness of the first ferromagnetic layer and second ferromagnetic layer is selected to achieve a resonant tunneling effect.

41. A disk drive system, comprising:

a magnetic recording disk;

a magnetic tunnel junction (MTJ) sensor including:
an antiferromagnetic (AFM) layer,
a first ferromagnetic layer with a pinned magnetization adjacent to the AFM layer for serving as a pinned layer,
a tunnel barrier layer adjacent to the first ferromagnetic layer,
a second ferromagnetic layer adjacent to the tunnel barrier layer,
a spacer adjacent to the second ferromagnetic layer,
a third ferromagnetic layer adjacent to the spacer for working in conjunction with the second ferromagnetic layer to serve as a free layer, the magnetization direction of the pinned layer being substantially perpendicular to the magnetization direction of the free layer at zero applied magnetic field, and
a cap layer adjacent to the third ferromagnetic layer,
wherein a thickness of the first ferromagnetic layer and second ferromagnetic layer is selected to achieve a resonant tunneling effect;

an actuator for moving the MTJ sensor across the magnetic recording disk so the MTJ sensor may access different regions of magnetically recorded data on the magnetic recording disk; and a controller electrically coupled to the MTJ sensor for detecting changes in resistance of the MTJ sensor.

* * * * *